United States Patent [19]

Yamanaka et al.

[11] Patent Number: 4,825,714
[45] Date of Patent: May 2, 1989

[54] PIVOTAL MICROMOTION DEVICE

[75] Inventors: Takeshi Yamanaka; Toshio Sasaoka, both of Otsu, Japan

[73] Assignee: Omron Tateisi Electronics Co., Kyoto, Japan

[21] Appl. No.: 27,058

[22] Filed: Mar. 23, 1987

Related U.S. Application Data

[63] Continuation of Ser. No. 790,531, Oct. 23, 1985, abandoned.

[30] Foreign Application Priority Data

Oct. 25, 1984 [JP] Japan .................... 59-225164

[51] Int. Cl.⁴ .............................................. F16H 25/24
[52] U.S. Cl. .................................... 74/89.15; 74/104
[58] Field of Search ................ 74/96, 99 R, 102, 104, 74/105, 110, 89.15

[56] References Cited

U.S. PATENT DOCUMENTS

| | | | |
|---|---|---|---|
| 3,147,766 | 9/1964 | Herring et al. | 74/89.15 |
| 3,407,018 | 10/1968 | Miller | 74/89.15 |
| 3,613,465 | 10/1971 | Wood | 74/110 |
| 4,572,028 | 2/1986 | Witte | 74/110 |

FOREIGN PATENT DOCUMENTS 55-142154 11/1980 Japan ........................ 74/96

OTHER PUBLICATIONS

*Ingenious Mechanisms For Designers & Inventors*, vol. III, Holbrook L. Horton, 1956, pp. 251–257.
*Ingenious Mechanisms For Designers & Inventors*, vol. IV, J. A. Newell et al., 1967, pp. 251–252.
*Mechanisms, Linkages & Mechanical Controls*, N. P. Chironis, 1965, p. 62.
Nikkei Mechanical, Feb. 27, 1984, pp. 86 and 87.

*Primary Examiner*—Allan D. Herrmann
*Attorney, Agent, or Firm*—Stevens, Davis, Miller & Mosher

[57] ABSTRACT

A pivotal micromotion device includes a straight movable body, a pivotal body, and, a mechanism for transmitting and transforming a straight motion of the movable body to a pivotal motion of the pivotal body. The tramsmitting mechanism comprises an elastic reduced angular movement transmitting member having a fixed end located on the pivotal body side and a free end located on the movable body side, respectively, so as to be disposed between the movable and pivotal bodies; a first engagement member for engaging the free end of the transmitting member with the movable body; and second engagement member for engaging a position between the fixed and free ends of the transmitting member with a position near an outer periphery of the pivotal body.

9 Claims, 2 Drawing Sheets

PIVOTAL MICROMOTION DEVICE

This application is a continuation of application Ser. No. 790,531, filed Oct. 23, 1985, now abandoned.

BACKGROUND OF THE INVENTION

1. Field of the Invention

The present invention relates generally to a pivotal micromotion device, and more specifically to a device used as means for finely adjusting pivotal motion with an ultrahigh accuracy in measuring instruments, machine tools, automated equipment, etc. for inspecting or manufacturing LSIs (large-scale integration circuits), for instance.

2. Description of the Prior Art

An example of the pivotal micromotion device as described above is introduced in NIKKEI MECHANICAL, 27th, Feb. 1984, page 86, FIG. 1.

This device is provided with a threaded rod driven by a pulse motor (or a step motor) and a movable body such as a nut engaged with the threaded rod and slightly movable along the longitudinal direction of the threaded rod without rotation. When this threaded rod is driven by the pulse motor, the movable body moves along the threaded rod. This straight motion or travel provides an external force to a pivotal body pivotably supported, through an appropriate transmission member such as a link, in the tangential direction of the pivotal body. Therefore, the pivotal body is pivoted a microscopic angle corresponding to the rotational angle of the threaded rod.

In the prior-art device as described above, in order to enhance the resolving power or the resolution in the pivoted angular displacement of the pivotal body, it is absolutely necessary to reduce the pitch of the threaded rod or the step angle of the pulse motor. However, there exists a machinability limit in reducing the pitch of the threaded rod, and the pulse motor becomes great in size and weight in reducing the step angle thereof, making it impossible to realize a compact pivotal micromotion device.

SUMMARY OF THE INVENTION

With these problems in mind, therefore, it is the object of the present invention to provide a pivotal micromotion device which can adjust microscopic pivotal motion with an ultrahigh accuracy and extremely high resolving power, without necessarily reducing the threaded rod pitch and the pulse motor step angle, in order to solve the above-mentioned problems involved in the prior-art device.

To achieve the above-mentioned object, the pivotal micromotion device according to the present invention comprises: a rotatably supported threaded rod; a movable body engaged with the threaded rod and supported movably along a longitudinal direction of the threaded rod without being rotated; a rotation drive mechanism for rotatably driving the threaded rod; a pivotal body pivotably supported and finely moved; a reduced angular movement transmitting member of elastic material having a fixed end fixed near a pivotal center of the pivotal body and a free end extending toward the movable body; first engagement means for engaging the free end of the transmitting member with the movable body; and second engagement means for engaging the transmitting member with a position near the outer periphery of the pivotal body at a predetermined position between the fixed end and free end of the transmitting member.

The transmitting member engages with the movable body at a first engagement position of free end thereof and simultaneously with the pivotal body at a second engagement position at an appropriate location between the fixed end and the free end thereof. When an external force is applied from the movable body to the free end of the transmitting member, the transmitting member is elastically deformed by a corresponding angular displacement with a position near the fixed end thereof as its pivotal center. Therefore, the transmitting member is also deformed at the second engagement position, so that the pivotal body is pivoted by a corresponding angular displacement. Since the value of displacement at the second engagement position is smaller than that at the first engagement position, it is possible to reduce the value of displacement of the pivotal body as compared with that of the movable body, thus it is possible to realize a pivotal micromotion with a high resolving power.

Further, since the transmitting member is deformed elastically, no play or clearance will be produced, thus resulting in a highly precise micromotion.

BRIEF DESCRIPTION OF THE DRAWINGS

The features and advantages of the pivotal micromotion device according to the present invention will be more clearly appreciated from the following description of the preferred embodiments of the invention taken in conjunction with the accompanying drawings in which.

DETAILED DESCRIPTION OF THE PREFERRED EMBODIMENTS

Figure 1:
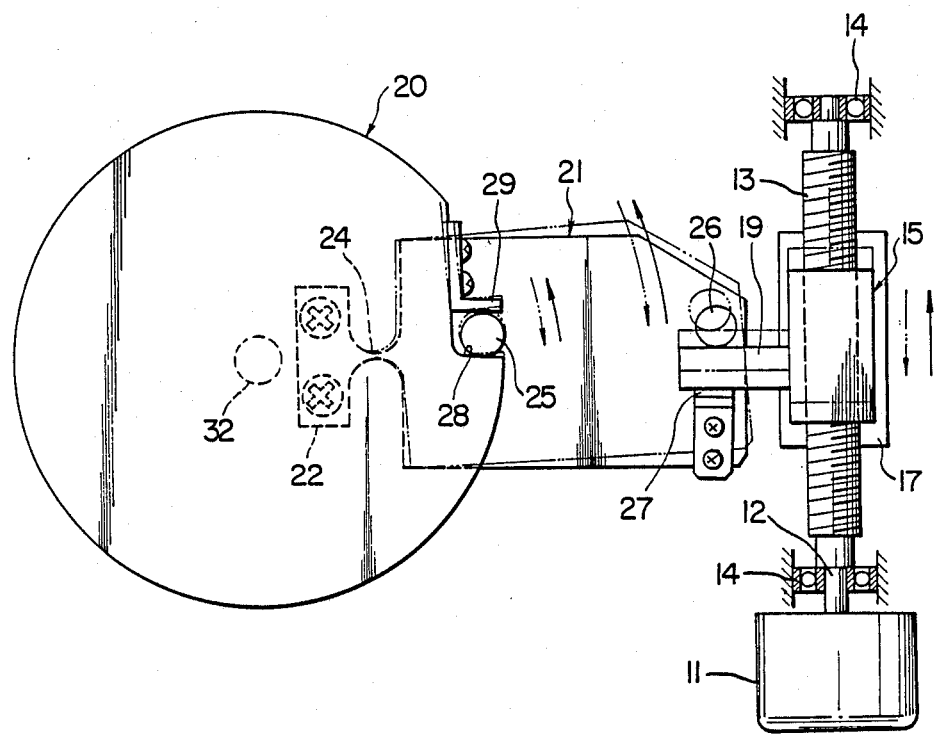
FIG. 1 is a plane view showing the pivotal micromotion device according to the present invention.
Figure 2:
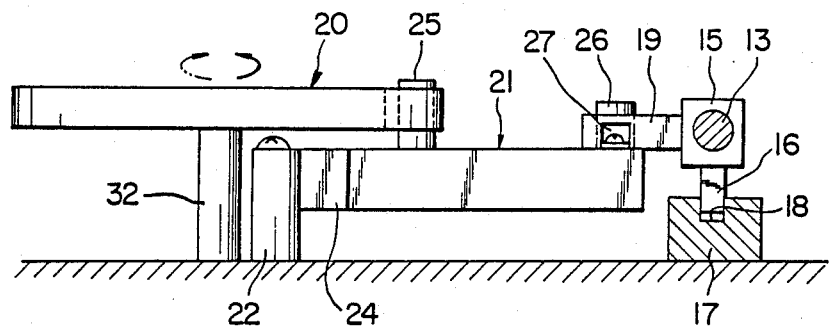
FIG. 2 is a side view showing the same device shown in FIG. 1.

In FIGS. 1 and 2, a threaded rod 13 is rotatably supported at both the ends thereof by two bearings 14, respectively. One end of this threaded rod 13 is directly connected to an output (driven) shaft 12 of a pulse (stepping) motor 11. However, it is also possible to link the output shaft 12 of the pulse motor 11 with the threaded rod 13 via a reduction gear mechanism having no backlash.

To this threaded rod 13, a movable body (such as nut) 15 is engaged. A slider member 16 is projectingly provided in one side surface (the bottom surface in FIG. 2) of this movable member 15. A guide member 17 fixed at an appropriate position on a frame, for instance, is formed with a guide groove 18 (shown in FIG. 2) along the longitudinal direction of the threaded rod 13. The slider member 16 of the movable body 15 is slidably received in this guide groove 18 formed in the guide member 17. Accordingly, the movable body 15 is supported in such a way as to be slidably movable along the longitudinal direction of the threaded rod 13 but not to be rotatable together with the threaded rod 13. An actuation member 19 extends from the other side surface of the movable body 15 toward a disk 20 described later.

The disk (rotary stage or pivotal body) 20 is rotatably or pivotably supported with its axle 32 being supported by bearings (not shown). The pivotal body 20 need not necessarily be in the form of the disk shown in FIG. 1, but any shape so supported as to be pivotable about its pivotal center will suffice. However, the disk 20 or the pivotal body is disposed so that a straight line connecting the center of the disk 20 and the middle point of the threaded rod 13 is nearly perpendicular to the longitudinal direction of the threaded rod 13.

A reduced angular movement transmitting member 21 is disposed between the axle 32 of the disk (pivotal body) 20 and the threaded rod 13. This transmitting member 21 has a fixed end portion on the side of the axle 32 of the disk 20 and a free end portion on the side of the threaded rod 13. The transmitting member 21 is formed with a leg portion 22 at its fixed end thereof, the leg portion 22 being fixed to a frame, for instance. In this transmitting member 21, a thin-wall portion 24 is formed near the leg portion 22. As described later, the transmitting member 21 is elastically deformed mainly on the basis of this thin-wall portion 24 on a surface parallel to that of the disc 20.

The transmitting member 21 is engaged with the actuation member 19 of the movable body 15 at its free end thereof. In further detail, a pin 26 is standingly implanted at the free end of the transmitting member 21 and additionally a holding or tension member 27 such as a tension leaf (spring) is provided. The actuation member 19 is tightly sandwiched between the pin 26 and the tension member 27.

The transmitting member 21 is engaged with the outer periphery of the disk 20 at a position between the thin-wall portion 24 and the free end, preferably near the thin-wall portion 24. To engage the transmitting member 21 with the disk 20, another pin 25 is standingly implanted at the engagement position of the transmitting member 21. On the other hand, a roughly right-angled cutout portion 28 is formed at an appropriate position of the outer periphery of the disk 20, and additionally another holding or tension member 29 such as a tension leaf (spring) is disposed therein. The pin 25 is tightly sandwiched between a part of the edge of the cutout portion 28 and the tension member 29.

In the pivotal micromotion device constructed as described above, the operation thereof is as follows: When the pulse motor 11 rotates, the threaded rod 13 also rotates. According to the rotational angle of the threaded rod 13, the movable body 15 is moved in the longitudinal direction of the threaded rod 13. When the movable body 15 is moved in the direction of the arrow as shown by a solid line in FIG. 1 (counterclockwise), the actuation member 19 pushes the pin 26, so that the transmitting member 21 is elastically deformed at its thin-wall portion 24 as shown by the dot-dot-dashed lines in FIG. 1 in such a way as to be pivoted with the thin-wall portion 24 as its pivotal center. therefore, the pin 25 is also displaced a very short distance, so that the disk 20 engaged with the pin 25 sandwiched between the cutout portion 28 and the tension member 29 of the disk 20 is pivoted by a small angle.

Since the distance between the thin-wall portion 24 and the pin 25 is determined to be fairly shorter than that between the thin-wall portion 24 and the pin 26, the value of displacement of the pin 25 is much smaller than that of the pin 26, so that it is possible to finely pivot the disk 20.

Since the transmitting member 21 is deformed in elastic manner, when the movable body 15 is moved in the direction of the arrow shown by a dot-dot-dashed line in FIG. 1 (clockwise), the transmitting member 21 and the disk 20 are both returned to their original positions simultaneously in the direction of dot-dot-dashed lines without producing any backlash or plays.

Each engagement member such as pin 25 or 26 is brought into pressure contact with the cutout portion 28 of the disk 20 and the actuation member 19, respectively, by the aid of each tension member 27 or 29 whenever the transmitting member 21 is being deformed clockwise or counterclockwise, so that there exists no play therebetween.

Figure 3:
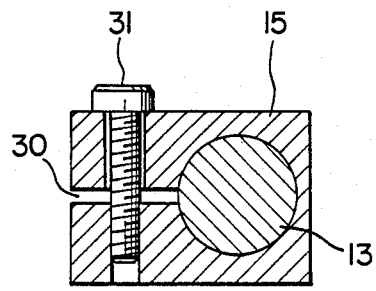
FIG. 3 is an enlarged longitudinal cross-sectional view showing some parts of the same device shown in FIG. 1.

As depicted in FIG. 3, it is preferable to form a split groove 30 in the movable body such as nut 15 in the longitudinal direction thereof. In this case, it is possible to adjust the fastening force between the threaded rod 13 and the nut 15 by adjusting the groove gap formed in this split groove 30 with an adjusting screw 31 as shown in FIG. 3, thus eliminating the backlash which may otherwise be produced between the threaded rod 13 and the nut 15.

Figure 4:
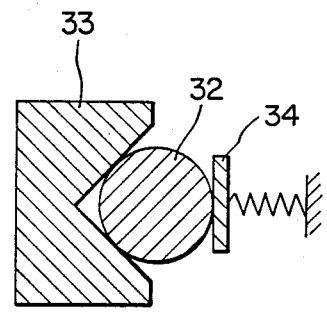
FIG. 4 is an enlarged lateral cross-sectional view showing other parts of the same device shown in FIG. 1.

Further, as depicted in FIG. 4, it is preferable to provide a play eliminating means for absorbing a play in the pivotal axle 32 of the disk 20. In this play eliminating means, the axle 32 is additionally supported in such a way as to be received by a V-shaped bearing block 33 on one side thereof and be urged by a plate 34 having a spring on the other side thereof so that the axle 32 can be sandwiched therebetween.

Furthermore, in FIG. 1, the degree of pivotal movement of the disk 20 is determined on the basis of the position of the pin 25. Therefore, the shorter the distance between the pin 25 and the thin-wall portion 24, the smaller the pivotal angle of the disk 20. In the case where a plurality of thin-wall portions are formed in the transmitting member 21, since the pivotal movement of the disk 20 is further reduced as compared with the straight movement of the movable body 15, it is possible to realize a pivotal micromotion device of an ultrahigh resolving power.

What is claimed is:

1. A pivotal micromotion device comprising:
   (a) a rotatably supported threaded rod;
   (b) a movable body engaged with said threaded rod and supported to move along a longitudinal direction of said threaded rod without being rotated;
   (c) a rotation drive mechanism for rotatably driving said threaded rod;
   (d) a pivotal body pivotably supported and finely movable;
   (e) a reduced angular movement transmitting member having a fixed end fixed near a pivotal center of said pivotal body and a free end extending toward said movable body and formed with a thin wall portion near said fixed end so as to be bent elastically;
   (f) first engagement means for engaging the free end of said transmitting member with said movable body; and
   (g) second engagement means for engaging said transmitting member with a position near an outer periphery of said pivotal body at a predetermined position between said thin wall portion and said free end of said transmitting member.

2. The pivotal micromotion device as set forth in claim 1, wherein said first engagement means comprises a projection member formed projecting from said movable body, and first means for receiving said projection member near the free end of said transmitting member.

3. The pivotal micromotion device as set forth in claim 2, wherein said first receiving means comprises a pin implanted in said transmitting member and a first holding member disposed near said pin, said projection member of said movable body being sandwiched between said pin and said first holding member disposed on said transmitting member.

4. The pivotal micromotion device as set forth in claim 1, wherein said second engagement means comprises a pin member implanted in said transmitting member, and second means for receiving said pin member near an outer periphery of said pivotal body.

5. The pivotal micromotion device as set forth in claim 4, wherein said second receiving means comprises a cutout portion formed in said pivotal body and a second holding member disposed in said cutout portion in said pivotal body, said pin member of said transmitting member being sandwiched between an edge of said cutout portion and said second holding member.

6. The device as in claim 1, wherein said fixed end is disposed closer to said pivotal center than to said movable body and said free end is disposed closer to said movable body than to said pivotal center.

7. The device as in claim 1, wherein said free end and said movable body are positioned outside said outer periphery of said pivotal body and said thin wall portion is positioned inside said outer periphery of said pivotal body.

8. A pivotal micromotion device comprising a movable body which moves along a straight path, a pivotably supported body, and a mechanism for transmitting a motion of said movable body along said straight path to said pivotably supported body to pivot the same, said transmitting mechanism comprising:

(a) A reduced angular movement transmitting member having a fixed end location adjacent said pivotably supported body and a free end located adjacent said movable body, respectively, and formed with a thin wall portion near said fixed end so as to be bendable elastically, said transmitting member being disposed between said movable body and said pivotably supported body;

(b) first engagement means for engaging the free end of said transmitting member with said movable body, said first engagement means permitting disengagement of said free end of said transmitting member from said movable body, said free end of said transmitting member being movable back and forth in accordance with back and forth movement of said movable body along said path; and (c) second engagement means for engaging a predetermined position between said thin wall portion and said free end of said transmitting member with a position near an outer periphery of said pivotably supported body, said second engagement means permitting disengagement of said predetermined position of said transmitting member from the said position of said pivotably supported body, said pivotably supported body rotating back and forth in accordance with back and forth movement of said movable body along said path.

9. A pivotal micromotion device comprising:
(a) a rotatably supported threaded rod;
(b) a movable body engaged with said threaded rod and supported to move along a longitudinal direction of said threaded rod without being rotated;
(c) a rotation drive mechanism for rotatably driving said threaded rod;
(d) a pivotal body pivotably supported and finely movable;
(e) a reduced angular movement transmitting member of elastic material having a fixed end fixed near a pivotal center of said pivotal body and a free end extending toward said movable body;
(f) first engagement means for engaging the free end of said transmitting member with said movable body; and
(g) second engagement means for engaging said transmitting member with a position near an outer periphery of said pivotal body at a predetermined position between the fixed end and free end of said transmitting member.

* * * * *